(12) United States Patent
Heubel

(10) Patent No.: US 9,098,984 B2
(45) Date of Patent: Aug. 4, 2015

(54) HAPTIC EFFECTS BROADCASTING DURING A GROUP EVENT

(71) Applicant: Immersion Corporation, San Jose, CA (US)

(72) Inventor: Robert W. Heubel, San Leandro, CA (US)

(73) Assignee: Immersion Corporation, San Jose, CA (US)

( * ) Notice: Subject to any disclaimer, the term of this patent is extended or adjusted under 35 U.S.C. 154(b) by 218 days.

(21) Appl. No.: 13/803,277

(22) Filed: Mar. 14, 2013

(65) Prior Publication Data

US 2014/0266644 A1    Sep. 18, 2014

(51) Int. Cl.
| | |
|---|---|
| *G09G 5/00* | (2006.01) |
| *G08B 6/00* | (2006.01) |
| *G06F 3/042* | (2006.01) |
| *G06F 3/0346* | (2013.01) |
| *G06F 3/01* | (2006.01) |
| *H04W 4/08* | (2009.01) |

(52) U.S. Cl.
CPC *G08B 6/00* (2013.01); *G06F 3/016* (2013.01); *G06F 3/0346* (2013.01); *G06F 3/0421* (2013.01); *H04W 4/08* (2013.01)

(58) Field of Classification Search
None
See application file for complete search history.

(56) References Cited

U.S. PATENT DOCUMENTS

| | | | |
|---|---|---|---|
| 8,207,832 B2* | 6/2012 | Yun et al. | 345/165 |
| 2009/0153350 A1 | 6/2009 | Steger et al. | |
| 2009/0270045 A1 | 10/2009 | Flaherty | |
| 2010/0169917 A1 | 7/2010 | Harboe et al. | |
| 2010/0267424 A1* | 10/2010 | Kim et al. | 345/173 |
| 2011/0169908 A1* | 7/2011 | Lee et al. | 348/14.02 |

OTHER PUBLICATIONS

J. Cha et al.; "A Framework for Haptic Broadcasting"; IEEE MultiMedia; vol. 16 No. 3; Jul.-Sep. 2009; pp. 1-26.
F. Danieau et al.; "Enhancing Audiovisual Experience with Haptic Feedback: a Survey on HAV"; Transactions on Haptics, hal-00766259; version 1; Dec. 18, 2012; pp. 1-15.

* cited by examiner

*Primary Examiner* — Muhammad N Edun
(74) *Attorney, Agent, or Firm* — Miles & Stockbridge P.C.

(57) ABSTRACT

A system that generates haptic effects on mobile devices during a group event receives an identity of a first type of haptic effect to be broadcast during the group event and determines a first set of the mobile devices during the group event that will generate the haptic effect. The system then broadcasts the first type of haptic effect to the first set of mobile devices during the group event.

23 Claims, 6 Drawing Sheets

//, US 9,098,984 B2

HAPTIC EFFECTS BROADCASTING DURING A GROUP EVENT

FIELD

One embodiment is directed generally to haptic effects, and in particular to haptic effects broadcasting during a group event.

BACKGROUND INFORMATION

Portable/mobile electronic devices, such as mobile phones, smartphones, camera phones, cameras, personal digital assistants ("PDA"s), etc., typically include output mechanisms to alert the user of certain events that occur with respect to the devices. For example, a cell phone normally includes a speaker for audibly notifying the user of an incoming telephone call event. The audible signal may include specific ringtones, musical ditties, sound effects, etc. In addition, cell phones may include display screens that can be used to visually notify the users of incoming phone calls.

In some mobile devices, kinesthetic feedback (such as active and resistive force feedback) and/or tactile feedback (such as vibration, texture, and heat) is also provided to the user, more generally known collectively as "haptic feedback" or "haptic effects". Haptic feedback can provide cues that enhance and simplify the user interface. Specifically, vibration effects, or vibrotactile haptic effects, may be useful in providing cues to users of electronic devices to alert the user to specific events, or provide realistic feedback to create greater sensory immersion within a simulated or virtual environment.

Further, during group events such as movies, music concerts, etc., various effects are typically broadcast to the group in attendance in a movie theater. In general, audio and video effects during a movie are broadcast to the group, and in some environments certain members of the group may experience different effects than other members. For example, some audio effects through the use of technology such as Dolby® Surround Sound, may sound different to a user depending on where that user is sitting in a theater. Further, some "three dimensional" experiences at theaters in theme parks provide "wind", "rain" and motion effects that may be specific to each seat in the theater, no matter who is sitting in the seat.

SUMMARY

One embodiment is a system that generates haptic effects on mobile devices during a group event. The system receives an identity of a first type of haptic effect to be broadcast during the group event and determines a first set of mobile devices during the group event that will generate the haptic effect. The system then broadcasts the first type of haptic effect to the first set of mobile devices during the group event.

DETAILED DESCRIPTION

One embodiment is a system in which haptic effects, in addition to possibly other effects such as audio and visual, is broadcast to a mobile device carried by each user in the audience/group for a group event. Each user may receive a different haptic effect at different times, depending on the location of the user in the group. As a result, the experience for each particular user of the group will likely be enhanced.

Figure 1:
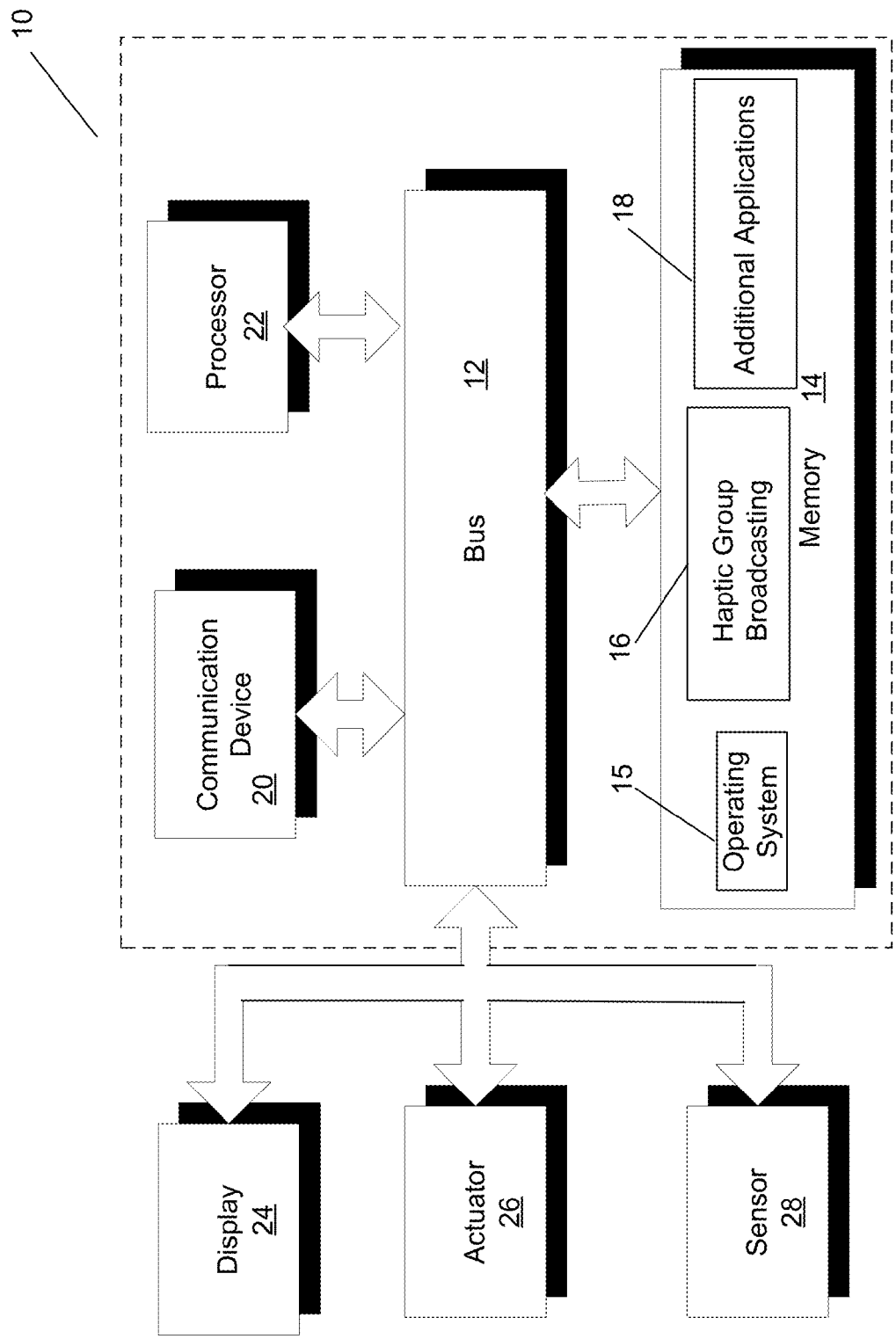
FIG. 1 is a block diagram of a system that can implement the central server of one embodiment of the invention, and can implement any of the mobile devices in separate embodiments of the invention.

In one embodiment, a central server/controller broadcasts haptic effects or other effects to one or more handheld or mobile devices that is in possession of each member or user of a group in a group event, such as a movie or concert. FIG. 1 is a block diagram of a system 10 that can implement the central server in one embodiment, and can implement any of the mobile devices in separate embodiments. For any of these implementations, all of the elements shown in FIG. 1 may not be needed or present. For example, in the central server where haptic effects are generally not generated directly on the server, the actuator shown in FIG. 1 may not be included.

System 10 includes a bus 12 or other communication mechanism for communicating information, and a processor 22 coupled to bus 12 for processing information. Processor 22 may be any type of general or specific purpose processor. Processor 12 can decide what haptic effects are to be played and the order in which the effects are played based on high level parameters. In general, the high level parameters that define a particular haptic effect include magnitude, frequency and duration. Low level parameters such as streaming motor commands could also be used to determine a particular haptic effect. A haptic effect may be considered "dynamic" if it includes some variation of these parameters when the haptic effect is generated or a variation of these parameters based on a user's interaction.

System 10 further includes a memory 14 for storing information and instructions to be executed by processor 22. Memory 14 can be comprised of any combination of random access memory ("RAM"), read only memory ("ROM"), static storage such as a magnetic or optical disk, flash memory, or any other type of computer-readable medium.

A computer readable medium may be any available medium that can be accessed by processor 22 and may include both a volatile and nonvolatile medium, a removable and non-removable medium, a communication medium, and a storage medium. A communication medium may include computer readable instructions, data structures, program modules or other data in a modulated data signal such as a carrier wave or other transport mechanism, and may include any other form of an information delivery medium known in the art. A storage medium may include RAM, flash memory, ROM, erasable programmable read-only memory ("EPROM"), electrically erasable programmable read-only memory ("EEPROM"), registers, hard disk, a removable disk, a compact disk read-only memory ("CD-ROM"), or any other form of a storage medium known in the art.

In one embodiment, memory 14 stores software modules that provide functionality when executed by processor 22. The modules include an operating system 15 that provides operating system functionality for system 10. The modules further include a haptic group broadcasting module 16 that broadcast haptic effects (when system 10 implements the central server), or receives and generates broadcasted haptic effects (when system 10 implements one of the mobile devices), as disclosed in more detail below. System 10 will typically include one or more additional application modules 18 to include additional functionality, such as software to support TouchSense® Haptic Feedback Technology from Immersion Corp.

System 10 further includes a communication device 20, such as a network interface card, to provide wireless network communication, such as Bluetooth, infrared, radio, Wi-Fi, or cellular network communication. The communication is between the central server and the mobile devices, and vice versa in some embodiments.

Processor 22 is further coupled via bus 12 to a display 24, such as a Liquid Crystal Display ("LCD"), for displaying a graphical representation or user interface to a user. The display 24 may be a touch-sensitive input device, such as a touchscreen, configured to send and receive signals from processor 22, and may be a multi-touch touchscreen. Display 24 can generate video effects, and further can include a speaker to generate audio effects.

System 10 further includes one or more actuators 26. Processor 22 may transmit a haptic signal associated with a haptic effect to actuator 26, which in turn outputs haptic effects. Actuator 26 may be, for example, an electric motor, an electro-magnetic actuator, a voice coil, a linear resonant actuator, a piezoelectric actuator, a shape memory alloy, an electro-active polymer, a solenoid, an eccentric rotating mass motor ("ERM") or a linear resonant actuator ("LRA").

In addition to actuator 26, system 10 may include other types of haptic output devices (not shown) that may be non-mechanical or non-vibratory devices such as devices that use electrostatic friction ("ESF"), ultrasonic surface friction ("USF"), devices that induce acoustic radiation pressure with an ultrasonic haptic transducer, devices that use a haptic substrate and a flexible or deformable surface or shape changing devices and that may be attached to a user's body, devices that provide projected haptic output such as a puff of air using an air jet, etc. Multiple haptic output devices with multiple haptic effects can generate a haptic effect.

The broadcasted haptic effects can include a wide range of effects and technologies, including vibrations, deformation, squeezing, poking, stretching, surface friction, heat, etc. The haptic effects can also be produced by the mobile device itself or by wearable accessories (e.g., a bracelet, a pair of glasses, shoes, a belt, etc.) or by other remote accessories (e.g., car keys, laptop computers, music players, or any other haptically enabled devices).

System 10 further includes one or more sensors 28. Sensor 28 may be an accelerometer, a gyroscope, a Global Positioning System ("GPS") sensor, a touch-sensitive input device (e.g., touchscreen, touchpad), a texture stylus, an imaging sensor, or some other type of sensor. Sensor 28 may be configured to detect changes in acceleration, inclination, inertia, or location. Sensor 28 may also be a location sensor, rotary velocity sensor, light sensor, pressure sensor, texture sensor, camera, microphone, or other type of sensor.

In accordance with one embodiment, the central server broadcasts synchronously (i.e., the same haptic effect to all people) or asynchronously (i.e., a varied effect depending on the location or attribute of each person) haptic effects to a group of users in conjunction with audio/visual events, allowing for an enhanced experience that could not otherwise be attained by audio/visual effects alone. Since most users may have a mobile device with them while having this viewing experience, a group haptic experience can be created using the devices synchronized with audio/visual events on the screen or stage. A group haptic effect can also be generated separate from the audio/visual event, such as a heartbeat simulating haptic effect even though there may be no heart beating audio or visual elements. Because the haptic effects are generated by the mobile devices themselves, embodiments are not a seat specific effect as with some known "three dimensional" viewing experiences. The central server may broadcast the actual haptic signal itself (i.e., haptic parameters) or an identity or functionality of the haptic effect so that a processor in each receiving mobile device can retrieve the haptic signal from memory or generate the haptic signal.

As is known in the art, different types of haptic effects can be generated by varying one or more of the haptic effect parameters such as magnitude, frequency or duration. Different types of haptic effects can also be generated by changing the type of actuator or other haptic output device that receives the motor signal and generates the haptic effects. For example, a haptic effect generated by an ERM actuator is a different type of haptic effect than one generated by an ESF device.

Embodiments that transmit haptic effects asynchronously based on the location of each user first determine the approximate location of each user in the group, where each user to receive the haptic effects carries a mobile device. Known methods for tracking/determining the current location of mobile devices can be used for this purpose. For example, if the event is outdoors, GPS-based technology can be used to determine an approximate location of a mobile device. If the event is indoors, such as in a movie theater, wireless access points in the theater can be used for providing indoor location functionality that tracks the position of mobile devices or smartphones, such as a "Micro-Location" system from Near-Buy Systems. Other methods to determine the location of each mobile device include Wi-Fi, Bluetooth, or near-field communication ("NFC") based location determination systems.

In one embodiment, each mobile device has a device identifier, and each mobile device (and optionally the corresponding user) is identified when the user is part of the group at the event. In one embodiment, each user will connect to the network at the event by logging in manually or automatically, or by using other methods of detection. Based on the identity of each mobile device, and a mapping of all of the mobile devices present in the group and corresponding seat location, the central server can broadcast different haptic effects to different devices based on location if desired. The identity may include the configuration of the mobile device, including an identity of the actuators and other haptic output devices available to generate haptic effects.

Embodiments of the present invention can generally be described in conjunction with an example of an group/audience seated in a movie theater watching a movie. As audience members watch and listen to the movie, they feel haptic effects/events triggered on their mobile devices based on specific events within the movie's "haptic track." The haptic effects transmitted to the audience's mobile devices may be:

Exactly the same for each audience member regardless of seating location or movie event timing (i.e., a synchronous experience for all);

Different for audience members based on seating location or movie event timing (i.e., an asynchronous experience);

Different for audience members based on both seating location and movie event timing (i.e., an asynchronous example);

May or may not also include audio/visual events transmitted to their mobile devices.

Figure 2:
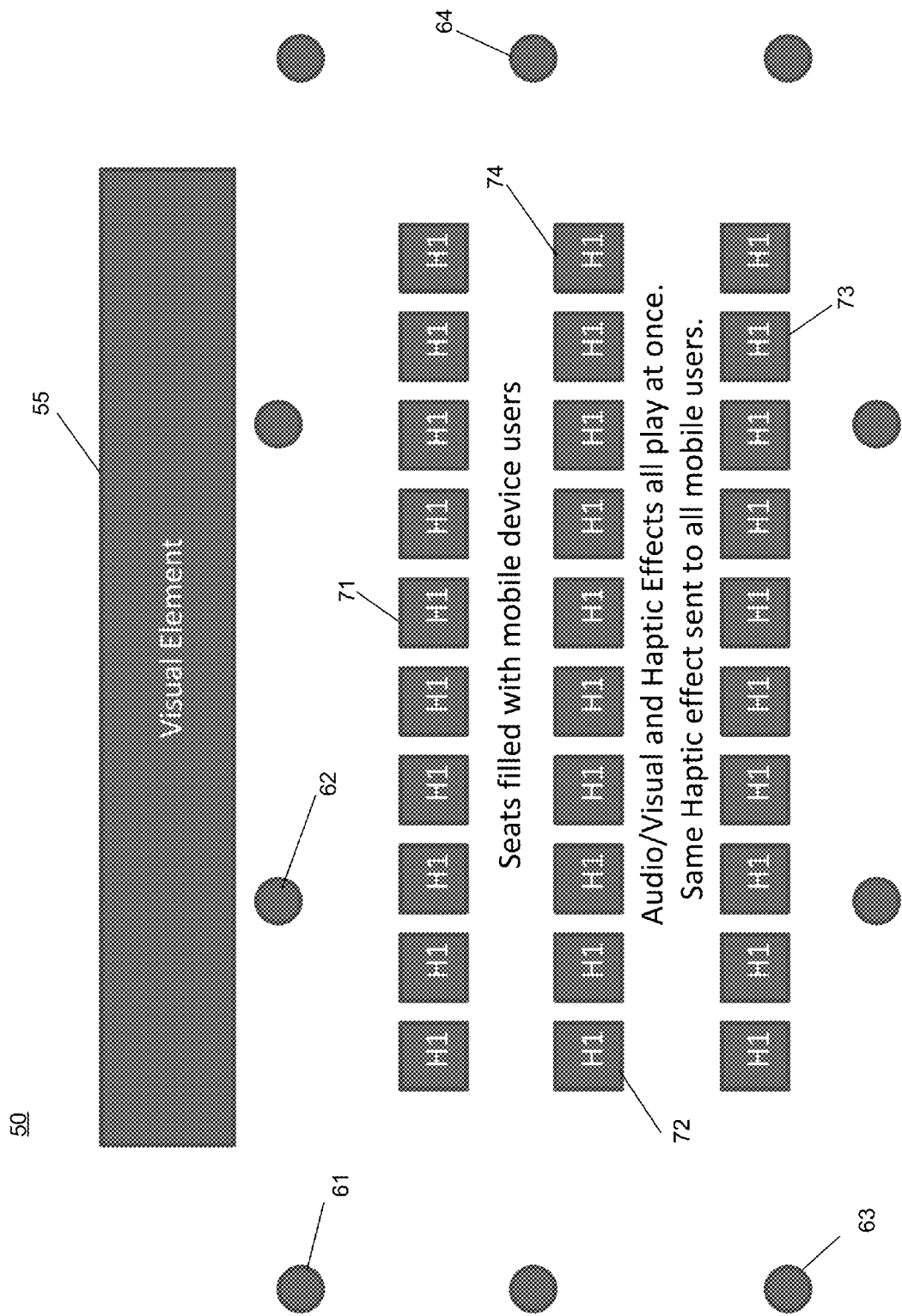
FIG. 2 is an overview diagram of a movie theater that illustrates a synchronous example in accordance with one embodiment.

FIG. 2 is an overview diagram of a movie theater 50 that illustrates a synchronous example in accordance with one embodiment. Movie theater 50 includes a visual element 55 (e.g., a movie screen), audio elements such as audio elements 61-64 (e.g., speakers that are part of a surround sound system), and seats such as seats 71-74, filled with users that each have a haptically-enabled mobile device such as can be implemented by system 10. Since the example of FIG. 2 is synchronous, each mobile device receives the same haptic effect (i.e., haptic effect "H1").

An event in the movie triggers the same haptic event to play on all users mobile devices at the same time in the synchronous example. For example, there may be a movie scene where it starts to rain and simultaneously everyone in the audience feels the same haptic raining sensation through a haptic effect H1 generated on their mobile device that simulates rain. In another example, all audience members receive the feel of a quickening heartbeat simulated haptic effect on their mobile devices as a character moves through a haunted house or sees their lover enter the room. In the example of FIG. 2, all audience members feel the same haptic effect at the same time, and the location of each user is not needed or utilized.

Figure 3:
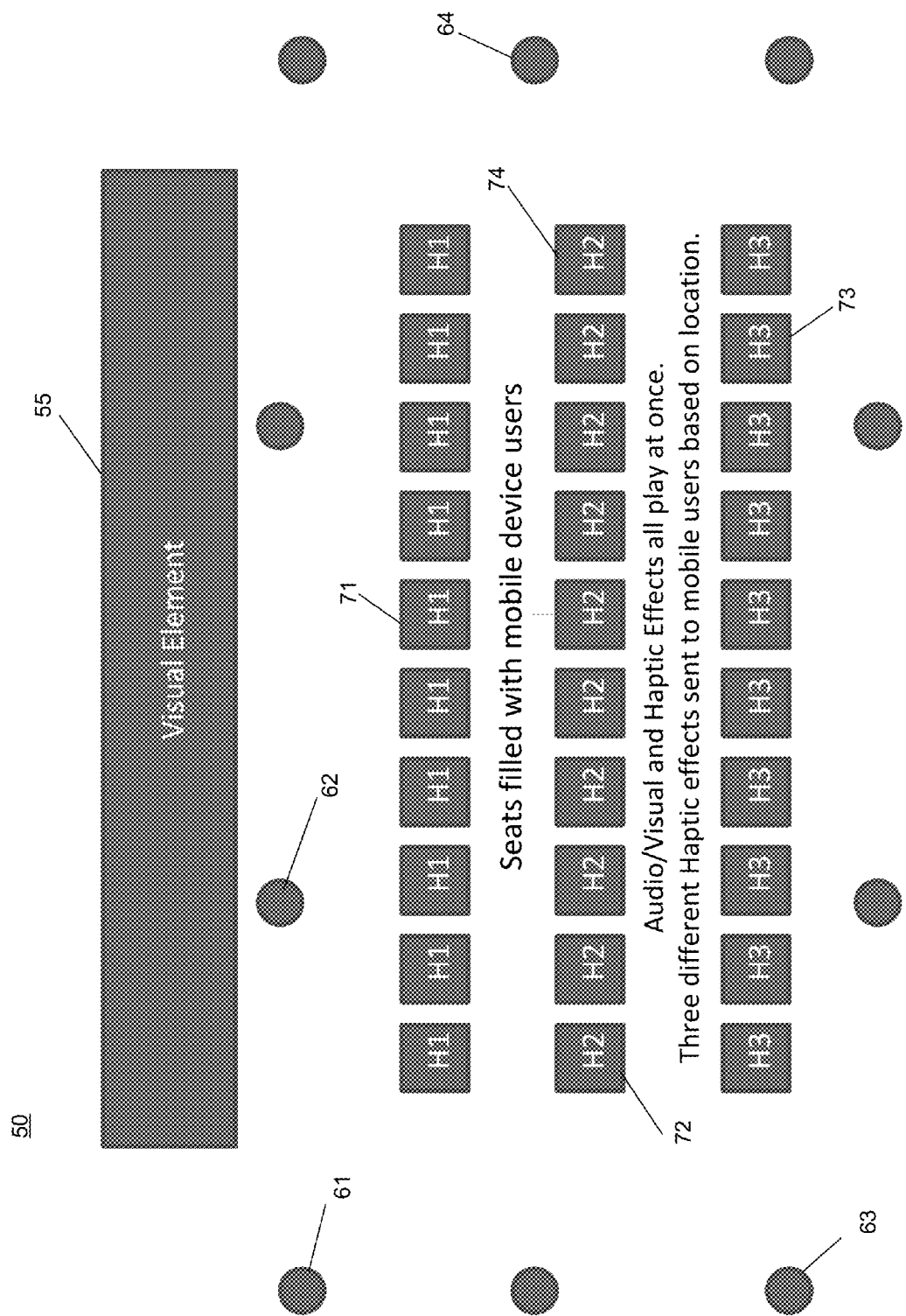
FIG. 3 is an overview diagram of the movie theater that illustrates another synchronous example in accordance with one embodiment.

FIG. 3 is an overview diagram of the movie theater 50 that illustrates another synchronous example in accordance with one embodiment. In this example, the location of the user is needed and the seating row that each user is sitting in is determined. The mobile device for each user is identified based on its location. In the example of FIG. 3, an event in the movie triggers the same haptic event to play on all mobile devices at the same time but the type of haptic effect may vary by location (i.e., haptic effect types "H1", "H2" or "H3"). For example, there may be a movie scene where an explosion occurs and those in the front row feel the haptic effect simulated force of the explosion more strongly than those in the middle or back rows through different haptic effect magnitudes.

Figure 4:
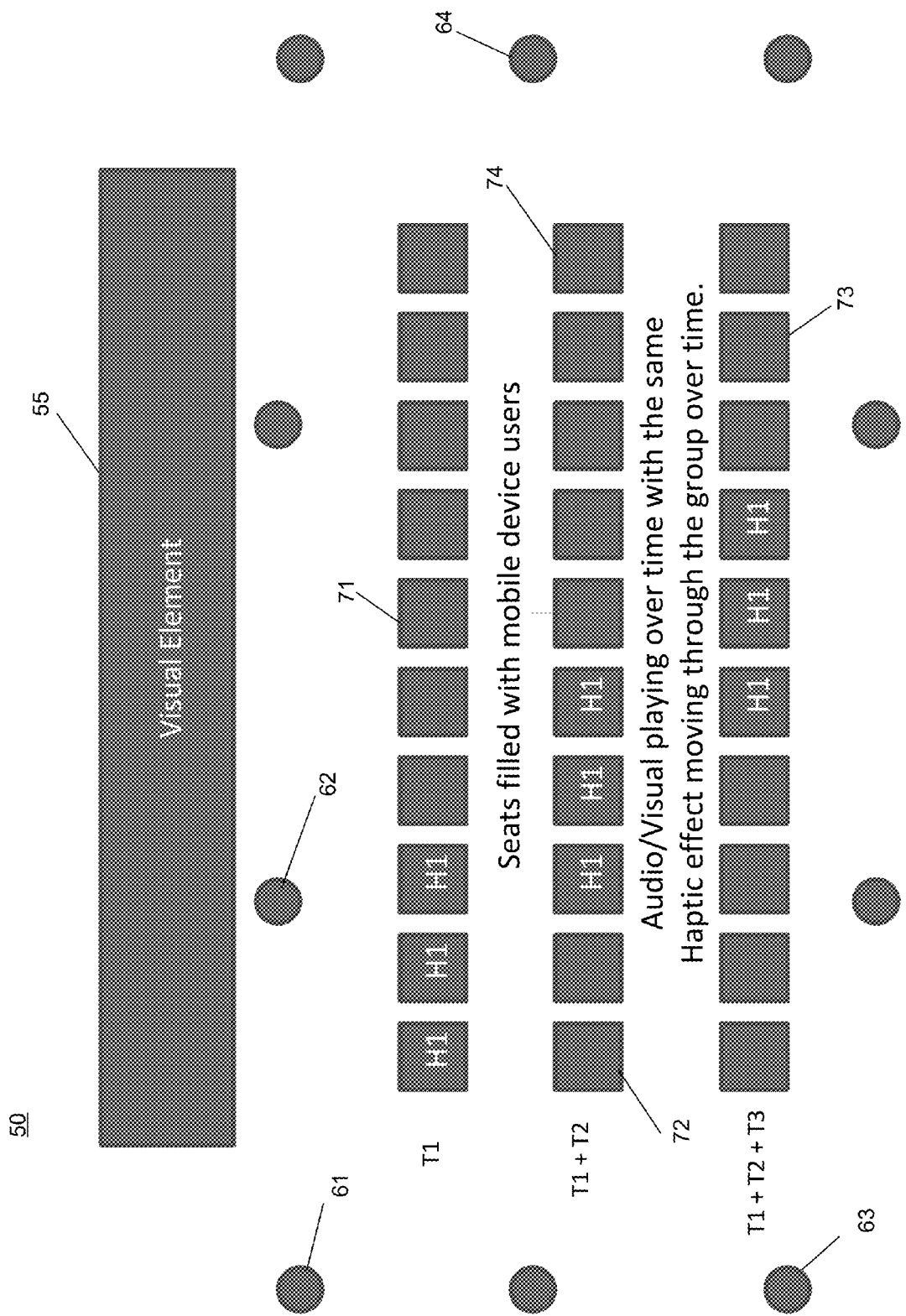
FIG. 4 is an overview diagram of the movie theater that illustrates an asynchronous example in accordance with one embodiment.

FIG. 4 is an overview diagram of the movie theater 50 that illustrates an asynchronous example in accordance with one embodiment. In this example, the location of the user is needed and the row that each user is sitting in is determined. Each user that receives a haptic event receives the same haptic effect (i.e., haptic effect "H1"). In the example of FIG. 4, an event in the movie triggers the same haptic events to play only on certain user devices over time. For example, there may be a movie scene where rats are running through a crowd and certain users feel a haptic effect in the front row (Time T1), it stops as that same effect is triggered for some users in the middle row (Time T1+T2) and then that effect stops as the same effect is triggered for a few users in the back row (Time T1+T2+T3). In another example based on movie event timing and seating location, a car may be racing from the left side of the screen to the right side. As the car moves across the screen a haptic effect could be sent to audience members representing the speeding car to the left side of the room and then transition over to the other audience members on the right side of the room as the car moves to the right side off the screen.

Figure 5:
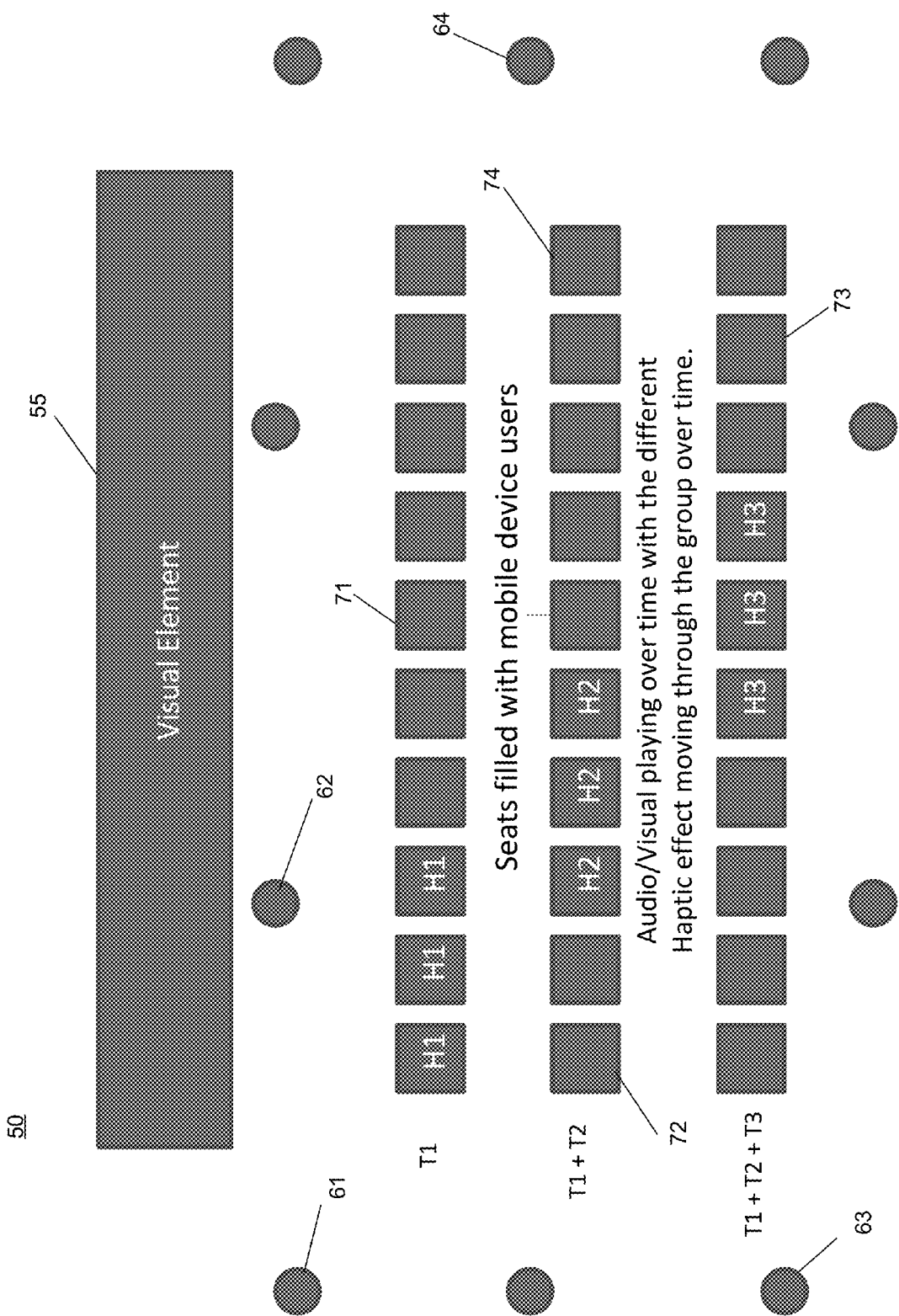
FIG. 5 is an overview diagram of the movie theater that illustrates another asynchronous example in accordance with one embodiment.

FIG. 5 is an overview diagram of the movie theater 50 that illustrates another asynchronous example in accordance with one embodiment. In the example of FIG. 5, an event in the movie triggers different haptic events to play only on certain user devices over time (i.e., haptic effects "H1", "H2" or "H3"). For example, there may be an air combat movie scene where a jet fighter destroys an enemy fighter that explodes in midair near the left side of the screen and the victorious fighter inevitably flies through the explosion. The users in the front row left side might feel a strong haptic explosion effect (Time T1) as the middle row middle-left users feel a lesser haptic effect triggered as the jet moves through the middle of the debris (Time T1+T2) and the users in the back middle feel a fading haptic effect a second later as the jet finishes moving through the debris cloud (Time T1+T2+T3).

Figure 6:
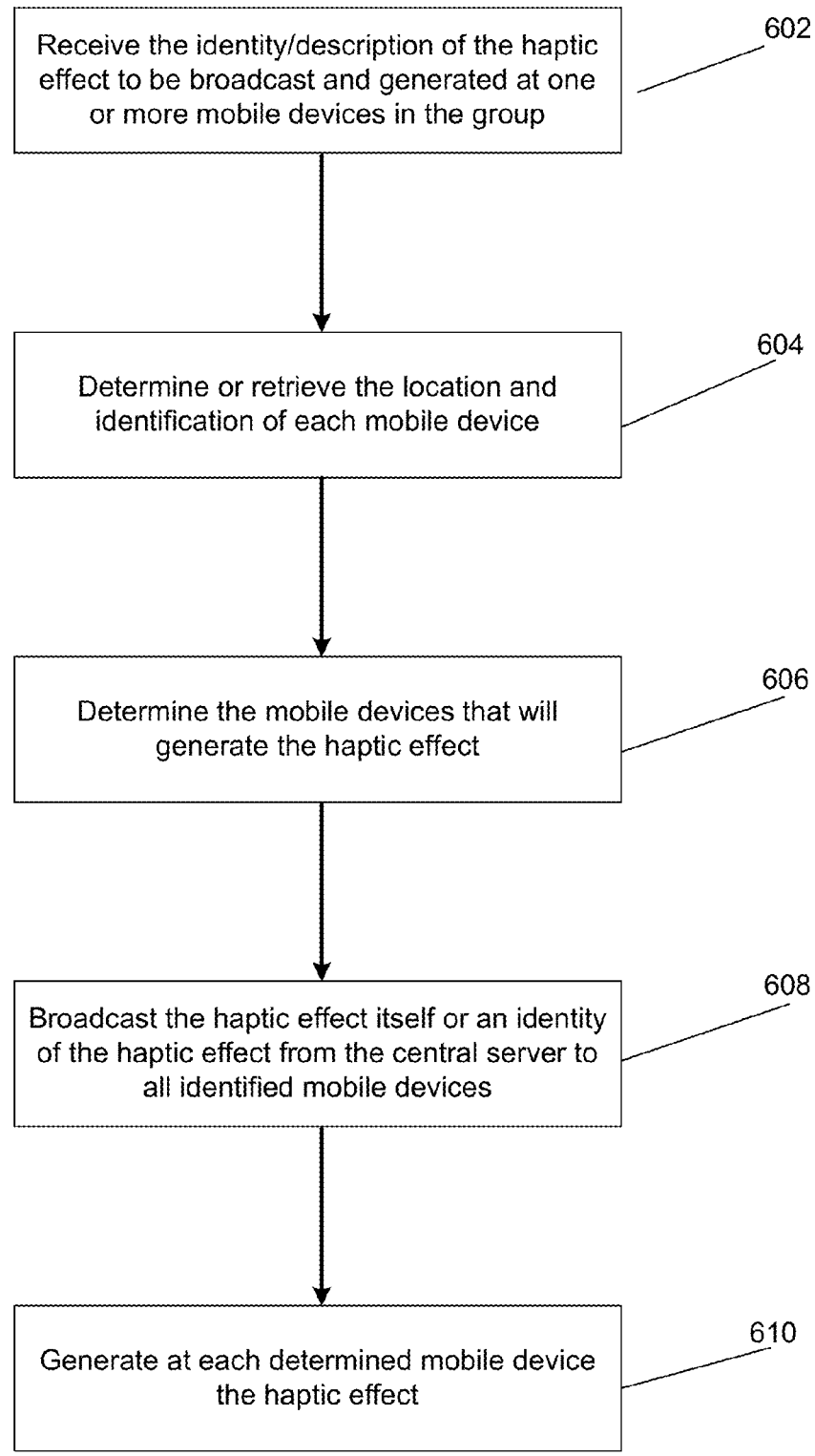
FIG. 6 is a flow diagram of the functionality of the haptic group broadcasting module and the system of FIG. 1 when broadcasting haptic effects, at the central server, or receiving and generating broadcasted haptic effects, at each mobile device, in accordance with one embodiment.

FIG. 6 is a flow diagram of the functionality of haptic group broadcasting module 16 and system 10 of FIG. 1 when broadcasting haptic effects, at the central server, or receiving and generating broadcasted haptic effects, at each mobile device, in accordance with one embodiment. In one embodiment, the functionality of the flow diagram of FIG. 6 is implemented by software stored in memory or other computer readable or tangible medium, and executed by a processor. In other embodiments, the functionality may be performed by hardware (e.g., through the use of an application specific integrated circuit ("ASIC"), a programmable gate array ("PGA"), a field programmable gate array ("FPGA"), etc.), or any combination of hardware and software.

At 602, the identity/description of the haptic effect to be broadcast and generated at one or more mobile devices in the group is received by the central server. In one embodiment, the haptic effects are synchronized with the audio and or video of the event, such as a movie timeline. Each haptic effect can be defined by high level parameters including magnitude, frequency and duration. In embodiments where only a subset of users will receive the haptic effect (e.g., the first row receives a first type of haptic effect, the second row a second type, etc.), the identity/description will include an identity of the one or more mobile devices to receive and generate the haptic effect.

At 604, if needed, the location and identification of each mobile device is determined or retrieved. As described above, the location and identification is determined using known techniques. The identification may include an identity of the actuators or other haptic output devices that are in each mobile device.

At 606, the mobile devices that will generate the haptic effect are determined. For some haptic effects, all mobile devices will generate the haptic effect, while for others only a subset of all of the mobile devices will generate the haptic effect.

At 608, the haptic effect itself or an identity of the haptic effect is broadcast from the central server to all identified mobile devices. In one embodiment, the haptic effect is generally broadcast to the entire group and includes an identifier of the mobile devices that are to generate the haptic effect. The mobile devices not identified will ignore the broadcasted haptic effect.

At 610, each determined mobile device from 606 will generate the haptic effect. In one embodiment, the haptic effect parameters will be retrieved from local memory and converted to motor signals that are sent to an actuator or other type of haptic output device. The actuator will then generate a vibratory based haptic effect, or any other kind of haptic effect as discussed above. The haptic effect may be generated as soon as the identity of the haptic effect is received from the broadcast, or the timing can be delayed as specified in the broadcast.

Embodiments can broadcast haptic effects, or a combination of haptic effects and audio and visual effects. Further, embodiments can broadcast the same haptic effects to all mobile devices, or base the broadcast on the location of the mobile devices. Further, embodiments can broadcast the same type of haptic effect to all mobile devices, or different types of haptic effects to different mobile device (i.e., each haptic effect is broadcast to a subset (some) of all mobile devices). The following is a description of some of the possible implementations in accordance with embodiments of the present invention:

"Single Effect Some—triggered at once synched w/AV": The same haptic effect is triggered at the same time only on some mobile devices in time with audio/visual content. An example is an explosion onscreen where only those seated closest to screen event are sent a haptic effect.

"Single Effect All—triggered at once synched w/AV": The same haptic effect is triggered on all devices at the same time in time with audio/visual content. An example would be an on screen explosion where every device is sent the same haptic parameters at the same time.

"Different Effect Some—triggered at once synched w/AV": Different haptic effects are triggered on all devices at the same time in time with audio/visual content. An example would be an explosion where those seated in the front row receive a stronger haptic effect than those in all other rows, but the effects are all triggered at the same time. As another example, the same effect type (e.g., a simulated gunshot haptic effect) but different haptic effect parameters are sent to some devices to compensate for different device actuator types (e.g., ERM, LRA, piezo, electrostatic, etc.). The goal is to create as consistent a haptic experience across all devices by sending different parameters to some of the devices.

"Different Effect All—triggered at once synched w/AV": A haptic effect is triggered at the same time only on some mobile devices in time with audio/visual content. All users feel an explosion haptic effect but with different parameters for each device which could be differences in intensities. Different device actuator types could also be compensated for as disclosed above.

"Single Effect Some—triggered at once synched w/A only": In an embodiment in which there is no visual element associated with the haptic effect, only audio, only those closest to the audio element feel the haptic effect at the same time. For example, only those seated in the back row of the experience hear a heatbeat in the rear speakers for the event and feel a simulated heartbeat haptic effect, but there is no visual heart beating onscreen, or perhaps the event has no screen at all as might happen at a concert hall.

"Single Effect All—triggered at once synched w/A only": Similar to "Single Effect Some—triggered at once synched w/A only" above, but the haptic effect would be sent to all devices equally at the same time.

"Different Effect Some—triggered at once synched w/A only": Similar to "Different Effect Some—triggered at once synched w/AV" above but without a visual element. Different device actuator types could also be compensated for as disclosed above.

"Different Effect All—triggered at once synched w/A only": Similar to "Different Effect All—triggered at once synched w/AV" above but without a visual element. Different device actuator types could also be compensated for as disclosed above.

"Single Effect Some—triggered at once synched w/V only": Similar to "Single Effect Some—triggered at once synched w/AV" above but without an audio element. For example, the haptic effect can be for a visual element that makes no sound, such as an explosion in space. The audience could see the visual element and have a haptic effect tied to the experience, but no audio is heard. Only those seated closest to the explosion might feel this haptic effect.

"Single Effect All—triggered at once synched w/V only": Same as "Single Effect Some—triggered at once synched w/V only" above but with the same haptic effect being sent to all devices.

"Different Effect Some—triggered at once synched w/V only": Same as "Different Effect Some—triggered at once synched w/AV" above but without an audio element. For example, the haptic effect can be for a three-dimensional movie where some three-dimensional object is projected out into the crowd, but without any associated sound. Those audience members most affected by the 3D effect could receive the greatest intensity of the haptic effect playback, those less affected might receive a lesser intensity haptic effect and still others might receive no haptic playback at all. Different device actuator types could also be compensated for, as disclosed above. All of these effects are triggered at one time, not over time.

"Different Effect All—triggered at once synched w/V only": Same as "Different Effect Some—triggered at once synched w/V only" above but some devices receive different haptic effect parameters that may include compensation for different actuator types.

"Single Effect Some—triggered at once separate from A/V": The same haptic effect is triggered at the same time only on some device but not tied to either audio/visual content. An example is completely ambient haptic events that help set the tone or set a warning within one portion of the audience. For example, in a scary movie there may be a need to warn a portion of the crowd of an upcoming scary moment so young children have a chance to cover their eyes. Further, in a concert experience just before the band enters the arena, if the band were entering from stage left or stage right, or even from within some portion of the audience area, it may be desired to send certain audience members a haptic effect to alert that part of the crowd that the band has arrived in their area but the haptic effect is not tied to any projected visual or audio media.

"Single Effect All—triggered at once separate from A/V": Same as "Single Effect Some—triggered at once separate from A/V" above, but the same haptic effect is projected to all devices.

"Different Effect Some—triggered at once separate from A/V": Same as "Single Effect Some—triggered at once separate from A/V" above but parameters of the haptic effect intensity could come into play based on device locations in the audience. Different device actuator types could also be compensated for as disclosed above.

"Different Effect All—triggered at once separate from A/V": Same as "Single Effect Some—triggered at once separate from A/V" above but across all devices in the broadcast the haptic effect parameters such as intensity could vary based on device locations in the audience. Different device actuator types could also be compensated for as disclosed above.

"Single Effect Some—triggered over time synched w/AV": An example is a haptic effect for a 3D movie where a some 3D object is projected out into the crowd with associated audio. As the 3D element crosses some threshold over time in relation to the audience members, the same haptic effect could be triggered where some audience members, perhaps in the back of the theater, might receive no haptic playback at all. A non-3D example is an object zooming from one side of the screen to the other where the same single haptic effect moves across the room but is only played on devices closest to the screen.

"Single Effect All—triggered over time synched w/AV": Same as "Single Effect Some—triggered over time synched w/AV" above, but all audience members would receive the same effect over time, meaning some threshold condition would be met to trigger haptic effects for all audience members. A non-3D example is an object zooming from one side of the screen to the other where the same single haptic effect moves across the room and is played on all devices in the broadcast.

"Different Effect Some—triggered over time synched w/AV": An example is an air combat movie scene where a jet fighter destroys an enemy fighter that explodes in midair near the left side of the screen and the victorious fighter inevitably flies through the explosion. The users in the front row left side might feel a strong haptic explosion effect as the middle row middle-left users feel a lesser haptic effect triggered as jet moves through the middle of the debris and the users in the back middle feel a fading haptic effect a second later as the jet finishes moving through the debris cloud. In this example a different effect is being played depending on the overall scene and not everyone in the audience necessary feels a haptic effect. Different device actuator types could also be compensated for as disclosed above.

"Different Effect All—triggered over time synched w/AV": Same as "Different Effect Some—triggered over time synched w/AV" above but all devices are included in the experience. Different device actuator types could also be compensated for as disclosed above.

"Single Effect Some—triggered over time synched w/A only": An example is a haptic effect for a surround sound of an invisible fly buzzing through the audience. The same haptic effect could be triggered over time only in areas of the theater where the fly sound is most prominent, but not on all user devices.

"Single Effect All—triggered over time synched w/A only": Same as "Single Effect Some—triggered over time synched w/A only" above but with the same haptic effect applied to all devices.

"Different Effect Some—triggered over time synched w/A only": Same as "Single Effect Some—triggered over time synched w/A only" above but with changes to the haptic effect parameters based on changes, for example, to the audio parameters. For example, if the sound of the fly intensified around some audience members, the haptic effect could also intensify in that area of the theater. Different device actuator types could also be compensated for as disclosed above.

"Different Effect All—triggered over time synched w/A only": Same as "Different Effect Some—triggered over time synched w/A only" above but haptic effects are playing back on all audience devices and haptic parameters can be different on each device. Different device actuator types could also be compensated for as disclosed above.

"Single Effect Some—triggered over time synched w/V only": Same as "Single Effect Some—triggered at once synched w/V only" above, but an explosion, or other visual element moves across the screen and as it does so, the same haptic effect is triggered for audience members closest to the moving object as a threshold trigger point is reached.

"Single Effect All—triggered over time synched w/V only": Same as "Single Effect Some—triggered over time synched w/V only" above, but all devices receive the same haptic effect when triggered.

"Different Effect Some—triggered over time synched w/V only": Similar to "Different Effect All—triggered over time synched w/AV" above but only based on visual media. Instead of jet fighters, an example is space fighters with no sound. Different device actuator types could also be compensated for as disclosed above.

"Different Effect All—triggered over time synched w/V only": Same as "Different Effect Some—triggered over time synched w/V only" above but all devices in the room experience the haptic effect playback. Different device actuator types could also be compensated for as disclosed above.

"Single Effect Some—triggered over time separate from A/V": Similar to "Single Effect Some—triggered at once separate from A/V" above, but the haptic effect may be moving through the crowd over time. For example, a "Haptic Wave" can be moving through the audience similar to how crowds stand-up in a stadium to make a "human wave" but in this instance not all audience members would receive the haptic event.

"Single Effect All—triggered over time separate from A/V": Same as "Single Effect Some—triggered over time separate from A/V" above, but all audience members would receive the haptic event.

"Different Effect Some—triggered over time separate from A/V": Same as "Single Effect Some—triggered over time separate from A/V" above but parameters of haptic effect intensity could come into play based on device locations in the audience. Different device actuator types could also be compensated for as disclosed above.

"Different Effect All—triggered over time separate from A/V": —Same as "Single Effect Some—triggered over time separate from A/V" above but across all devices in the broadcast where the haptic effect parameters, such as intensity, could vary based on device locations in the audience. Different device actuator types could also be compensated for as disclosed above.

As disclosed above, some embodiments broadcast haptic effects in response to an audio specific event such as live musical concert. In this embodiment, synchronous and asynchronous haptic events are implemented using a streaming conversion of the live performance into haptic events for the audience. For example, synchronous haptic effects may be generated through a straight audio to haptic event conversion that is broadcast, and all audience members feel the same haptic effect regardless of location. An asynchronous embodiment can be linked to a Surround Sound where what is felt by the audience is tied to where they are located in the audience. In this embodiment, what is broadcast to the front/center/back of the audience, as well as left/right sides may depend specifically on what is being projected by the sound system surround dynamics.

Further, in both movie and concert embodiments, audio and visual elements can also be broadcast to the mobile devices. These additional elements could be synchronized with the main media content, or can be asynchronous. As with the example of the rats moving through the audience, the haptic experience may be enhanced with localized visual or audio coming straight from the user's devices.

In addition to the above embodiments, users may be able to customize their experience by the selection of software settings on their mobile device, such as by turning the strength of the haptic experience up or down in magnitude or emphasizing certain elements of the media, including: (1) changing the bass or treble range; (2) increasing the ambient content, such as the heartbeat example in the movie; (3) Adding additional audio/video broadcast to the devices along with the haptics. Further, in some embodiments the broadcast is filtered so that a user of a mobile device only feels via haptic effects specific elements of the content. For example, the filtering can cause a user to feel only certain instruments in a music broadcast or specific visual elements in a visual broadcast.

As disclosed, embodiments broadcast haptic effects to an audience of one or more. Embodiments include or function with multi-modal media containing sound and/or video with a "haptic track" and communication between the played media and the audience's mobile devices. Embodiments may include application level support or a software switch on mobile devices to interface with multi-modal content. This may be an application such as a custom video player or an application that acts as a haptic receiver on the user side. Haptic events from the haptic track are played in relation to this media on the audience's mobile devices. Location mapping of all mobile devices in the audience allow for both synchronous and asynchronous haptic effect playback over time and can create a "surround haptics" experience.

Several embodiments are specifically illustrated and/or described herein. However, it will be appreciated that modifications and variations of the disclosed embodiments are covered by the above teachings and within the purview of the appended claims without departing from the spirit and intended scope of the invention.

What is claimed is:

1. A method of generating haptic effects on mobile devices during a group event, the method comprising:
   receiving an identity of a first type of haptic effect to be broadcast during the group event, wherein the group event comprises a plurality of audio events and a haptic track that comprises a plurality of haptic events;
   determining a first set of the mobile devices during the group event that will generate the first type of haptic effect; and
   broadcasting the first type of haptic effect to the first set of mobile devices during the group event, wherein the first type of haptic effect is synchronized with one of the haptic events and one or more of the audio events.

2. The method of claim 1, further comprising:
   determining a location and an identification of a second set of the mobile devices, wherein the second set comprises all mobile devices that are configured to receive a haptic effect broadcast during the group event.

3. The method of claim 2, wherein the first set of mobile devices comprises a subset of the second set of mobile devices.

4. The method of claim 2, wherein determining the first set mobile devices is based at least on the location of each of the first set of mobile devices.

5. The method of claim 1, wherein the identity of the first type of haptic effect is received from the haptic track.

6. The method of claim 1, wherein the first set of mobile devices comprises all mobile devices that are configured to receive a haptic effect broadcast during the group event.

7. The method of claim 1, further comprising:
   receiving an identity of a second type of haptic effect to be broadcast during the group event;
   determining a third set of the mobile devices during the group event that will generate the second type of haptic effect; and
   broadcasting the second type of haptic effect to the third set of mobile devices during the group event;
   wherein the second type of haptic effect is a different type than the first type of haptic effect.

8. The method of claim 7, wherein the first type of haptic effect is broadcast at approximately the same time as the second type of haptic effect, and the first set of mobile devices are different mobile devices than the second set of mobile devices.

9. A non-transitory computer-readable medium having instructions stored thereon that, when executed by a processor, cause the processor to generate haptic effects on mobile devices during a group event, the generating comprising:
   receiving an identity of a first type of haptic effect to be broadcast during the group event, wherein the group event comprises a plurality of audio events and a haptic track that comprises a plurality of haptic events;
   determining a first set of the mobile devices during the group event that will generate the first type of haptic effect; and
   broadcasting the first type of haptic effect to the first set of mobile devices during the group event, wherein the first type of haptic effect is synchronized with one of the haptic events and one or more of the audio events.

10. The computer-readable medium of claim 9, the generating further comprising:
    determining a location and an identification of a second set of the mobile devices, wherein the second set comprises all mobile devices that are configured to receive a haptic effect broadcast during the group event.

11. The computer-readable medium of claim 10, wherein the first set of mobile devices comprises a subset of the second set of mobile devices.

12. The computer-readable medium of claim 10, wherein determining the first set mobile devices is based at least on the location of each of the first set of mobile devices.

13. The computer-readable medium of claim 9, wherein the identity of the first type of haptic effect is received from the haptic track.

14. The computer-readable medium of claim 9, wherein the first set of mobile devices comprises all mobile devices that are configured to receive a haptic effect broadcast during the group event.

15. The computer-readable medium of claim 9, the generating further comprising:
    receiving an identity of a second type of haptic effect to be broadcast during the group event;
    determining a third set of the mobile devices during the group event that will generate the second type of haptic effect; and
    broadcasting the second type of haptic effect to the third set of mobile devices during the group event;
    wherein the second type of haptic effect is a different type than the first type of haptic effect.

16. The computer-readable medium of claim 15, wherein the first type of haptic effect is broadcast at approximately the same time as the second type of haptic effect, and the first set of mobile devices are different mobile devices than the second set of mobile devices.

17. A broadcast system for a group event, the system comprising;
    a determining module that, in response to receiving an identity of a first type of haptic effect, determines one or more of a plurality of mobile devices that are present during the group event, wherein the group event comprises a plurality of audio events and a haptic track that comprises a plurality of haptic events; and
    a broadcast module that broadcast the first type of haptic effect to the determined plurality of mobile devices, wherein the first type of haptic effect is synchronized with one of the haptic events and one or more of the audio events.

18. The broadcast system of claim 17, wherein the determined plurality of mobile devices comprise all mobile devices that are configured to receive a haptic effect broadcast during the group event.

19. The broadcast system of claim 17, wherein the determined plurality of mobile devices comprise less than all mobile devices that are configured to receive a haptic effect broadcast during the group event.

20. The broadcast system of claim 17, further comprising:
a location module that determines a location of all mobile devices that are configured to receive a haptic effect broadcast during the group event.

21. The broadcast system of claim 20, wherein the determining module determines one or more of the plurality of mobile devices that are present during the group event based at least on the location of each of the plurality of mobile devices.

22. The broadcast system of claim 17, wherein the first type of haptic effect is defined using haptic effect parameters.

23. The broadcast system of claim 17, wherein the first type of haptic effect is defined by specifying a haptic output device.

* * * * *